United States Patent
Fischer

(12) 
(10) Patent No.: US 6,563,389 B1
(45) Date of Patent: May 13, 2003

(54) PHASE LOCKED LOOP WITH CHARGE INJECTION CANCELLATION

(75) Inventor: Gerald R. Fischer, Playa Del Rey, CA (US)

(73) Assignee: Northrop Grumman Corporation, Redondo Beach, CA (US)

( * ) Notice: Subject to any disclaimer, the term of this patent is extended or adjusted under 35 U.S.C. 154(b) by 15 days.

(21) Appl. No.: 10/001,714

(22) Filed: Oct. 24, 2001

(51) Int. Cl.[7] .......................... H03L 7/00; H03L 7/085; H03L 7/093

(52) U.S. Cl. .................. 331/17; 331/8; 331/25; 327/156; 327/157

(58) Field of Search .................. 331/8, 15, 17, 331/18, 25, DIG. 2; 327/156–159; 332/127; 360/51; 375/376; 455/260

(56) References Cited

U.S. PATENT DOCUMENTS 6,476,681 B1 * 11/2002 Kirkpatrick .................. 331/17

* cited by examiner

*Primary Examiner*—David C. Mis
(74) *Attorney, Agent, or Firm*—Harness, Dickey & Pierce, P.L.C.

(57) ABSTRACT

A phase locked loop (10) for generating an output frequency signal. The phase locked loop (10) includes a controlled oscillator (14) to generate the output frequency signal in response to a tune signal. A phase detector (18) generates an error signal representing a difference between a reference frequency signal and the output frequency signal. A loop filter (12) having a filter characteristic, filters the error signal and generates the tune signal. The loop filter (12) includes a bandwidth switching circuit (19) to vary the filter characteristics. A charge cancellation circuit (22) is coupled to the loop filter (12). In response to the error signal, the charge cancellation circuit (22) cancels errors associated with the bandwidth switching circuit.

19 Claims, 3 Drawing Sheets

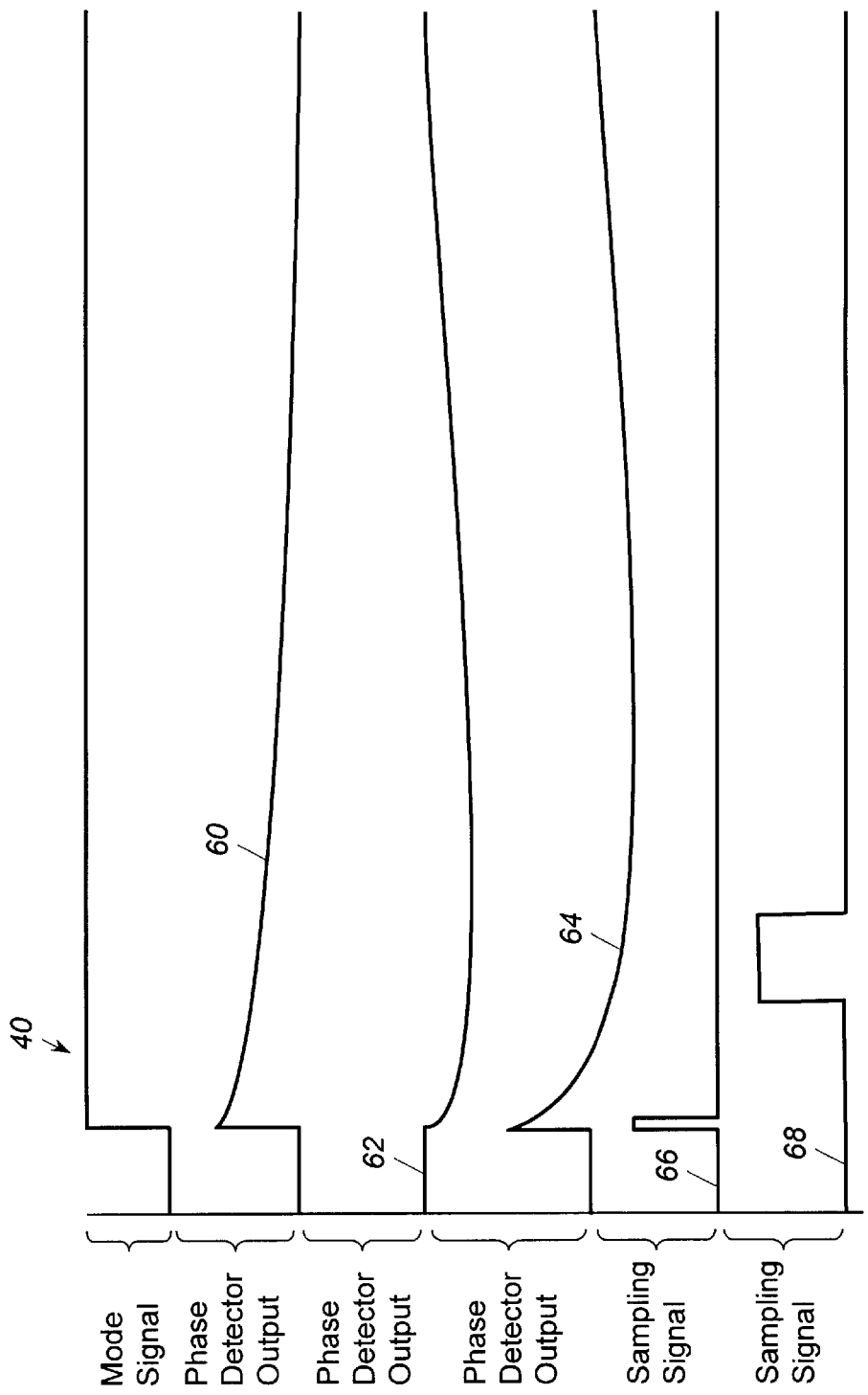

PHASE LOCKED LOOP WITH CHARGE INJECTION CANCELLATION

This application is related to co-pending application Ser. No. 10/209,379 filed Jul. 31, 2002, entitled "Low Noise Switched Low Pass Filter With Benign Transients," by the same inventor.

BACKGROUND OF THE INVENTION

1. Field of the Invention

The present invention relates generally to phase locked loops, and in particular to phase locked loops that have switched circuit elements to alter loop bandwidth and related characteristics.

2. Discussion of the Related Art

A phase locked loop (PLL) is a negative feedback system that maintains a constant phase and zero frequency difference between a variable frequency and a reference frequency. Conventional PLL's include a phase detector element to compare the frequency and phase of an oscillator to that of the reference frequency. The oscillator is then controlled to maintain the constant phase and frequency difference.

The speed with which the phase locked loop can transition from one lock point (or frequency) to the next is a limiting performance factor in many applications. The phase locked loop is therefore often designed with two control system bandwidths (or loop transfer functions): one is a very wide bandwidth that is used to rapidly tune the synthesizer away from the last locked frequency toward the new frequency, and the other is the final narrow bandwidth that is used to provide stable low noise operation during the time that the new frequency is being supplied and the communication channel is active. However, construction of such a dual bandwidth phase locked loop generally requires the use of switches to alter circuit characteristics by selecting different circuit components such as resistors and capacitors. Physically realizable switches and the associated circuits suffer from a phenomenon, known as "charge injection", which introduces a disturbance into the other circuit elements at the time the switch is activated. Charge injection generally occurs as the result of the switch control signal entering the signal path via parasitic capacitive coupling. The resulting effect is the injection of an amount of charge equal to the voltage change in the control signal times the size of the parasitic capacitor. The disturbance caused by charge injection may form a new limitation on the speed of the phase locked loop tuning because the disturbance must be resolved by the slower narrow bandwidth PLL control system.

SUMMARY OF THE INVENTION

According to one embodiment of this invention a system and method for generating a phase locked loop output frequency signal is provided. The phase locked loop includes a controlled oscillator to generate the output frequency signal in response to a tune signal. A phase detector generates an error signal representing a difference between a reference frequency signal and the output frequency signal. A loop filter having a filter characteristic, filters the error signal and generates the tune signal. The loop filter includes a bandwidth switching circuit to vary the filter characteristic. A charge cancellation circuit is coupled to the loop filter. In response to the error signal, the charge cancellation circuit cancels errors associated with the bandwidth switching circuit.

For a more complete understanding of the invention, its objects and advantages, reference may be had to the following specification and to the accompanying drawings.

BRIEF DESCRIPTION OF THE DRAWINGS

FIG. 3 illustrates a set of waveforms corresponding to the phase locked loop of the invention.

DETAILED DESCRIPTION OF THE EMBODIMENTS OF THE INVENTION

Figure 1:
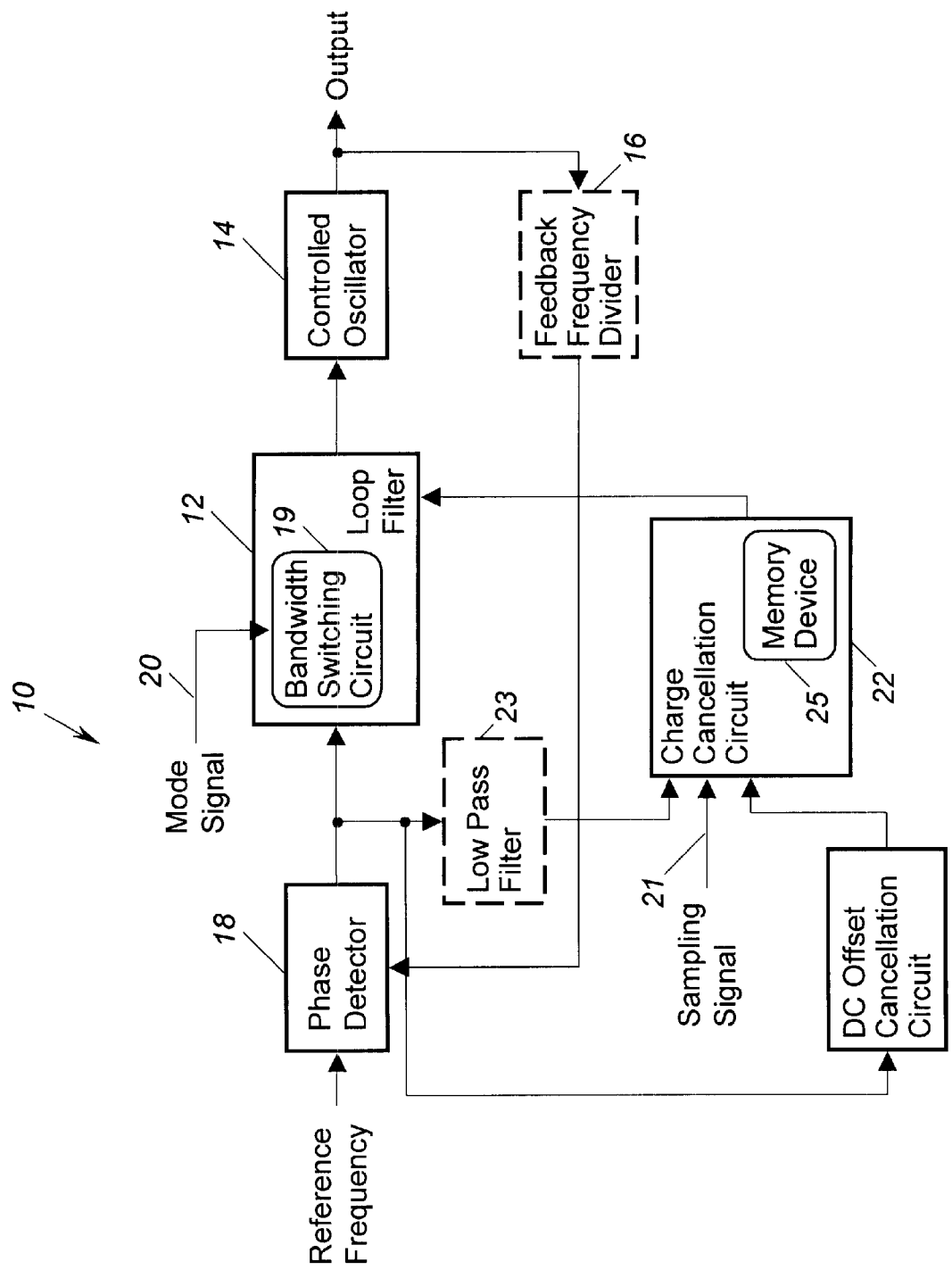
FIG. 1 illustrates a block diagram of a phase locked loop with bandwidth control in accordance with the teachings of the invention.

Referring to FIG. 1, a phase locked loop (PLL) 10 according to the present invention is shown. The PLL 10 includes a controlled oscillator 14 for generating an output frequency signal in response to a tuning signal. A feedback frequency divider 16 senses the output frequency signal and generates a divided frequency signal. Although a feedback frequency divider 16 is preferably included in the PLL 10, the scope of the invention does not require the inclusion of a feedback frequency divider. A phase detector 18 compares the frequency and phase of the divided frequency signal to the frequency and phase of a reference frequency signal and generates an error signal to represent the difference between the reference frequency signal and the divided frequency signal. A loop filter 12 coupled to the phase detector 18 generates the tuning signal from the error signal. The loop filter 12 attenuates noise and high frequency components that are present in the error signal. The loop filter 12 includes at least one bandwidth switching circuit 19 to control the bandwidth mode of the loop filter 12. A mode signal 20 controls the bandwidth switching circuit 19 to select the filter bandwidth mode. A charge cancellation circuit 22 coupled from the phase detector 18 to the loop filter 12 generates a cancellation charge that is of a similar nature to that generated by the switching of the bandwidth switching circuit 19 with opposite sign. The opposing cancellation charge is injected into the loop filter 12 to cancel the effects of charge injection caused by the bandwidth switching circuit 19.

The charge cancellation circuit 22 takes a sample of a voltage within the PLL 10 that represents phase error at a time when the transient phase error due to charge injection is expected to be at a maximum, such as shortly after the bandwidth switching circuit 19 has been exercised and the time response of the narrow bandwidth mode PLL transfer function is at a maximum. A non-zero sample value is taken as an indication that a charge injection response is present. The sample is used to increment a memory element 25 that controls the amplitude of the cancellation charge. Preferably, the PLL 10 is regularly commanded to tune from frequency to frequency, or, at least, can be regularly commanded to exercise the bandwidth switching circuit 19 even if the PLL output frequency is not actually commanded to change. This regular operation of the bandwidth switching circuit 19 gives the charge cancellation circuit 22 regular opportunities to examine and compensate for the effect of charge injection. Preferably, the examination opportunities are sufficiently frequent so that changes in the circuit operating characteristics can be compensated for by the charge cancellation circuit 22. Examples of changing operating characteristics include the effects of temperature drift on charge injection, leakage current changes in the memory element, and component variations in the charge cancellation circuit 22.

The scope of the invention includes using several types of phase detector 18 such as mixer-based phase detectors that generate a difference signal that comprises an AC component with a DC offset, wherein the DC offset indicates the amount of the difference and the frequency of the AC component is related to frequencies of the detected signals. The error signal is preferably directly coupled to the charge cancellation circuit 22 which samples the error signal a predetermined delay time after the PLL 10 changes bandwidth mode. Preferably, the error signal is sampled at approximately the same instant within each cycle so that the AC component of the signal is negated, leaving the DC offset as the error signal. A low pass filter 23 may be inserted between the phase detector 18 and the charge cancellation circuit 22 to attenuate the AC signal.

Another well known phase detector generates a difference signal that is comprised of a series of pulses that correspond to the difference. The duration of an error signal pulse reflects the magnitude of the difference in the phases of the signals. Preferably, the error signal pulse is converted to a voltage level by an element such as a low pass filter. The voltage level represents the magnitude of the difference.

Figure 2:
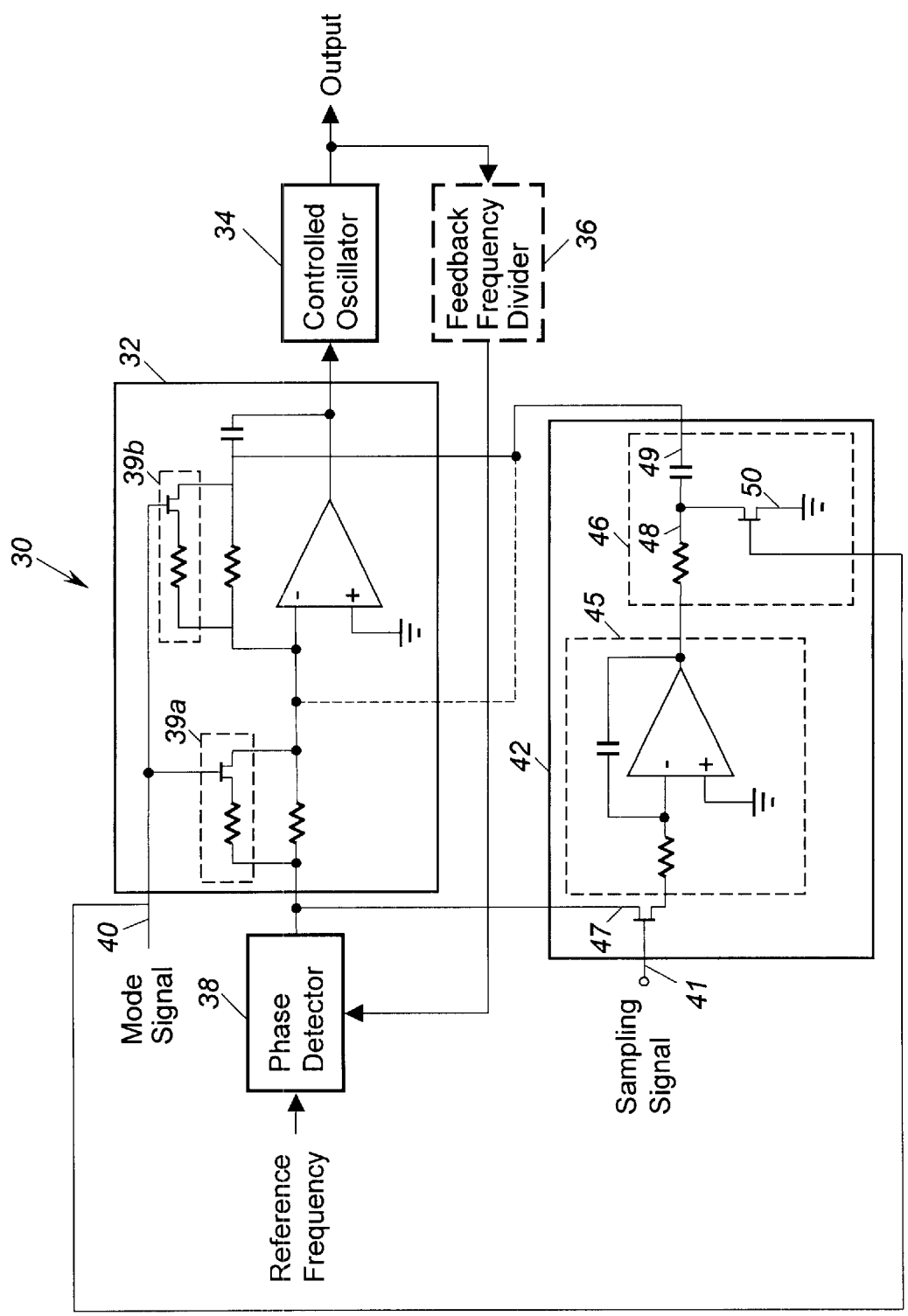
FIG. 2 illustrates a circuit diagram of an embodiment of a phase locked loop with bandwidth control in accordance with the teachings of the invention.

Referring to FIG. 2, a schematic of a presently preferred embodiment of a phase locked loop 30 in accordance with the teachings of the invention is illustrated. The phase locked loop 30 includes a loop filter 32, a voltage controlled oscillator 34, a feedback frequency divider 36, a phase detector 38, and a charge cancellation circuit 42.

The loop filter 32 includes an amplifier with bandwidth switching circuits 39a and 39b coupled across respectively the input circuit and the feedback circuit. A mode signal 40 controls the switching of the bandwidth switching circuits 39a and 39b to change the filter characteristic to either wide bandwidth or narrow bandwidth. During switching of the bandwidth switching circuits 39a and 39b, undesirable charge injection is typically introduced through the parasitic capacitance of the associated switches. Although in the presently preferred embodiment two bandwidth switching circuits 39a and 39b are used, it is within the scope of the invention to use one or more bandwidth switching circuits to control the filter attenuation characteristics. In addition, the loop filter bandwidth may be controlled by bandwidth switching circuits 39 that are in series or shunt with other resistors/capacitors of the loop filter 32. Also, within the scope of the invention are loop filters comprised of passive components with bandwidth switching circuits and single order to multi-order filters that are either active or passive.

In the presently preferred embodiment, the phase detector 38 generates a difference signal that is comprised of a series of pulses that correspond to the difference. The duration of a difference signal pulse reflects the magnitude of the difference in the phases of the signals. The difference signal is filtered by a detector filter (not shown) to provide an error signal in which the high frequency components have been attenuated.

The charge cancellation circuit 42 includes a sampling switch 47 that is controlled by a sampling signal 41 that preferably takes a sample of a voltage within the PLL 30 that represents phase error at a time when the transient phase error should be at a maximum such as shortly after the bandwidth switching elements have been exercised and the time response of the narrow bandwidth PLL transfer function is at a maximum. The sampling switch 47 is preferably coupled to the phase detector 38 to sample the error signal that is generated by the phase detector 38. The sampling switch 47 is preferably a field effect transistor (FET), however, the scope of the invention includes using other controllable devices such as bipolar junction transistors.

A memory device 45 stores the voltage level of the sampled error pulse until another sample is received. The scope of the invention includes using both digital memory devices as well as analog memory devices. The memory device forms the sum of the value of the present sample with the values of all prior samples in the manner of an accumulator or integrator. The memory device 45 in the presently preferred embodiment is an amplifier configured as an integrator. In response to receiving the error signal, the integrator generates an output voltage that is increased or decreased in proportion to the charge created by the voltage level of the error signal and the pulse duration of the sampling signal. The output voltage of the memory device 45 is coupled to a pulse generator 46.

The pulse generator 46 forms a charge pulse from the memory device output voltage. The charge pulse is injected into the loop filter 32 to compensate for undesirable charge injection from the bandwidth switching circuits 39a and 39b. In the presently preferred embodiment the pulse generator 46 includes a resistor 48 and capacitor 49 in series with a shunt switch 50. The charge pulse from the pulse generator 46 is coupled into the PLL 30 prior to the controlled oscillator 34. Preferably, the charge pulse is coupled into the loop filter 32 at approximately the circuit location where the bandwidth switching circuits 39 inject undesirable charge. Although FIG. 2 shows only one charge cancellation circuit 42, in the presently preferred embodiment the charge cancellation circuit 42 is implemented twice in order to individually cancel the unique disturbances created by the two unique bandwidth control switches 39a and 39b. The charge pulse from one such circuit is injected into the feedback network of the loop filter 32 (depicted by the solid line shown connected to capacitor 49) and the charge pulse from the other cancellation circuit is injected into the input network of the loop filter 32 (depicted by the dashed line shown connected to capacitor 49).

In operation, shortly after the bandwidth switching circuits 39a and 39b have been exercised the sampling switch 47 samples the error signal from the phase detector 38 at approximately the moment when the loop response to parasitic charge injection is expected. A non-zero sample value is taken as an indication that a charge injection response is present and the sample is used to increment the memory device 45. Preferably, the PLL 30 is regularly commanded to tune from frequency to frequency, or at least is regularly commanded to exercise the bandwidth switching circuits 39 even if the PLL output frequency is not actually commanded to change. This regular operation of the bandwidth switching circuits 39a and 39b gives the charge cancellation circuit 42 regular opportunities to examine the effect of charge injection and update the memory device 45 that controls the amount of cancellation charge. Preferably, the update opportunities are sufficiently frequent to compensate for changes in the charge injection (due to temperature drift or other effects), operating characteristics of the memory device 45 (such as leakage in a capacitor), and changes in the charge cancellation circuit 42.

The sampled error signal provides an error voltage to the memory device 45, which arrives at a voltage sufficient to produce an equal and opposite charge injection from the pulse generator 46. The cancellation loop reaches a steady state solution when the error voltage is near zero and the pulse amplitude and resulting charge injection balances the original charge injection.

It will be appreciated that the sampling element, the integrator, the charge pulse circuit, and the PLL's response to charge injection, together form a feedback control system loop and that the action of this loop does not substantially interfere with the proper operation of the phase locked loop control system. In the presently preferred embodiment, the loop is a first order loop but the scope of the invention includes other types of loops with higher orders which might be used, for example, to allow compensation of charge injection phenomena that change rapidly. The bandwidth of the loop must also be set lower than the rate of sampling to avoid instability. The bandwidth of the loop must be sufficiently low to reject the influence of any high frequency AC or noise present in the samples, such that the loop achieves a steady average response that matches the parasitic charge injection.

Referring to FIG. 3, waveforms associated with the presently preferred embodiment of the phase locked loop 30 are shown. The first waveform shows the mode signal 40 during a switching event from a wideband PLL mode to a narrowband mode. This event produces the PLL phase error responses shown in the second and third waveforms 60 and 62. The second waveform 60 illustrates the response due to charge injection at the virtual ground of the PLL loop filter op-amp. The third waveform 62 illustrates the response due to injection between the feedback resistor and capacitor of the PLL loop filter 32. The response time corresponds to approximately one loop time constant. A fourth waveform 64 is the composite of the second and third waveforms 60 and 62, and is the actual waveform that is present at the phase detector output. The fifth waveform 66 is the sampling signal 41 used for one cancellation loop that corrects the error response illustrated in the second waveform 60. It detects the amplitude of the initial fast rise in the composite waveform 64. The sixth waveform 68 is the sampling signal 41 used for a second cancellation loop that corrects the third waveform 62 error response.

Thus it will be appreciated from the above that as a result of the present invention, a system and method for generating a phase locked output signal is provided by which the principal objectives, among others, are completely fulfilled. It will be equally apparent and is contemplated that modification and/or changes may be made in the illustrated embodiment without departure from the invention. Accordingly, it is expressly intended that the foregoing description and accompanying drawings are illustrative of preferred embodiments only, not limiting, and that the true spirit and scope of the present invention will be determined by reference to the appended claims and their legal equivalent.

What is claimed is:

1. A phase locked loop comprising:
   a controlled oscillator to generate an output frequency signal in response to a tune signal;
   a phase detector to generate an error signal representing a difference between a reference frequency signal and the variable output frequency signal;
   a loop filter having filter characteristics to filter the error signal and generate the tune signal, the loop filter including a bandwidth switching circuit to vary the filter characteristics; and
   a charge cancellation circuit coupled to the loop filter, responsive to the error signal, to cancel errors associated with the bandwidth switching circuit.

2. The phase locked loop of claim 1 further comprising a feedback frequency divider coupled between the controlled oscillator and the phase detector, operable to generate a divided frequency signal from the variable output frequency signal; and
   the error signal representing the difference between the reference frequency signal and the divided frequency signal.

3. The phase locked loop of claim 1 wherein the charge cancellation circuit includes a memory device for storing error information.

4. The phase locked loop of claim 1 wherein the charge cancellation circuit includes a sampling switch, a memory device and a pulse generator.

5. The phase locked loop of claim 4 wherein the memory device is an integrator.

6. The phase locked loop of claim 4 wherein the bandwidth switching circuit includes a bandwidth mode switch having electrical characteristics; and
   wherein the charge cancellation circuit further includes an output switch coupled between the memory device and the loop filter, the output switch having electrical characteristics that approximately match the electrical characteristics of the bandwidth mode switch.

7. The phase locked loop of claim 1 wherein the bandwidth switching circuit includes two bandwidth mode switches.

8. The phase locked loop of claim 1 wherein the error signal includes a series of pulses that correspond to the difference.

9. The phase locked loop of claim 1 wherein the error signal includes an AC component with a DC offset, the DC offset indicates the difference.

10. A phase locked loop comprising:
    a controlled oscillator to generate a variable output frequency signal in response to a tune signal;
    a feedback frequency divider coupled to the controlled oscillator, operable to generate a divided frequency signal from the variable output frequency signal;
    a phase detector to generate an error signal representing a difference between a reference frequency signal and the divided frequency signal, the error signal including a voltage level that correspond to the difference;
    a loop filter having filter characteristics to filter the error signal and generate the tune signal, the loop filter including a bandwidth switching circuit to vary the filter characteristics; and
    a charge cancellation circuit coupled to the loop filter, responsive to the error signal, to cancel errors associated with the bandwidth switching circuit.

11. The phase locked loop of claim 10 wherein the charge cancellation circuit includes a memory device for storing error information.

12. The phase locked loop of claim 10 wherein the charge cancellation circuit includes:
    a sampling switch to sample the error signal at a predetermined time period after a transient event;
    a memory device to store error information; and
    a pulse generator to generate a compensating pulse corresponding to the stored error information such that phase errors associated with the bandwidth switching circuit are reduced.

13. The phase locked loop of claim 12 wherein the memory device is an integrator.

14. The phase locked loop of claim 12 wherein the bandwidth switching circuit includes a bandwidth mode switch having electrical characteristics; and
    wherein the charge cancellation pulse generator has electrical characteristics that approximately match the electrical characteristics of the bandwidth mode switch.

15. A phase locked loop having at least two bandwidth modes, comprising:

means for generating a variable output frequency signal corresponding to a tune signal;

means for frequency dividing the variable output frequency signal such that a divided frequency signal is generated;

means for detecting a difference between a reference frequency signal and the divided frequency signal;

means for generating an error signal representing the difference, the error signal including a series of pulses to represent the difference;

means for filtering to filter the error signal and generate the tune signal, the filtering means including means for bandwidth mode switching to select a bandwidth mode; and a charge cancellation circuit coupled to the loop filter, responsive to the error signal, to cancel errors associated with the bandwidth mode switching means.

16. A method of generating a controlled frequency signal, comprising:

generating a variable output frequency signal in response to a tune signal;

frequency dividing the variable output frequency signal so that a divided frequency signal is generated;

detecting a difference between a reference frequency signal and the divided frequency signal;

generating a difference signal having a series of pulses to represent the difference;

selecting a bandwidth mode of a loop filter for filtering the error signal;

filtering the error signal such that the tune signal is generated; and responsive to a sampling signal, coupling a compensating charge into the loop filter to cancel errors associated with selecting the bandwidth mode.

17. The method of claim 16 wherein the step of coupling the compensating charge is in response to the difference signal.

18. The method of claim 16 further comprising filtering the difference signal so that an error signal having a voltage level that is representative of the difference is generated.

19. The method of claim 18 wherein the step of coupling the compensating charge is in response to the error signal.

* * * * *